US012805221B2

(12) United States Patent
Murakami

(10) Patent No.: US 12,805,221 B2
(45) Date of Patent: Nov. 17, 2026

(54) FILLING METHOD AND SUBSTRATE PROCESSING SYSTEM

(71) Applicant: Tokyo Electron Limited, Tokyo (JP)

(72) Inventor: Hiroki Murakami, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/850,155

(22) PCT Filed: Mar. 16, 2023

(86) PCT No.: PCT/JP2023/010360

§ 371 (c)(1),
(2) Date: Sep. 24, 2024

(87) PCT Pub. No.: WO2023/189667

PCT Pub. Date: Oct. 5, 2023

(65) Prior Publication Data

US 2025/0218769 A1 Jul. 3, 2025

(30) Foreign Application Priority Data

Mar. 29, 2022 (JP) ................................ 2022-054037

(51) Int. Cl.
*H10P 14/60* (2026.01)
*H10P 14/692* (2026.01)
*H10P 14/694* (2026.01)

(52) U.S. Cl.
CPC ...... *H10P 14/6529* (2026.01); *H10P 14/6339* (2026.01); *H10P 14/6548* (2026.01); *H10P 14/69215* (2026.01); *H10P 14/69433* (2026.01)

(58) Field of Classification Search
CPC ........... C23C 16/45523; C23C 16/455; C23C 16/448; C23C 16/44
See application file for complete search history.

(56) References Cited

U.S. PATENT DOCUMENTS

2009/0286381 A1* 11/2009 van Schravendijk ........................ H10W 10/014 257/E21.546
2019/0157093 A1* 5/2019 Sasahara ............... H10P 50/242
2019/0295887 A1* 9/2019 Trickett .............. H10P 72/0461

FOREIGN PATENT DOCUMENTS

JP 2012-004542 A 1/2012
JP 2021-061348 A 4/2021

* cited by examiner

*Primary Examiner* — Kelly M Gambetta
(74) *Attorney, Agent, or Firm* — Armstrong Teasdale LLP

(57) ABSTRACT

A filling method of filling a film containing a predetermined element into a recess formed on a substrate includes (a) forming, in a first chamber, a first film, which is the film containing the predetermined element, (b) forming, in a second chamber, a modified layer by exposing the first film to gas including a halogen-containing gas, (c) forming, in the second chamber, a protective film covering the modified layer, (d) sublimating, in a third chamber, the modified layer by etching the protective film, and (e) forming, in the third chamber, a second film, which is the film containing the predetermined element.

13 Claims, 11 Drawing Sheets

FILLING METHOD AND SUBSTRATE PROCESSING SYSTEM

CROSS-REFERENCE TO RELATED APPLICATIONS

The present application is a U.S. National Stage Entry of International Patent Application No. PCT/JP2023/010360, filed Mar. 16, 2023, which claims the benefit of priority to Japanese Patent Application No. 2022-054037, filed Mar. 29, 2022, each of which is hereby incorporated herein by reference in its entirety.

TECHNICAL FIELD

The present disclosure relates to a filling method and a substrate processing system.

BACKGROUND

For example, Patent Documents 1 and 2 propose a method of filling a recess with a desired film by repeating a film formation process and an etching process a predetermined number of times. By combining film formation and etching, it is possible to suppress occurrence of a void when filling the recess with the desired film.

PRIOR ART DOCUMENTS

Patent Documents

Patent Document 1: Japanese Patent Laid-Open Publication No. 2012-004542

Patent Document 2: Japanese Patent Laid-Open Publication No. 2021-061348

The present disclosure provides some embodiments of a technique capable of improving film properties by protecting a film in a recess from contamination.

SUMMARY

According to one embodiment of the present disclosure, there is provided a method of filling a film containing a predetermined element into a recess formed on a substrate, including (a) forming, in a first chamber, a first film, which is the film containing the predetermined element, (b) forming, in a second chamber, a modified layer by exposing the first film to a gas including a halogen-containing gas, (c) forming, in the second chamber, a protective film covering the modified layer, (d) sublimating, in a third chamber, the modified layer by etching the protective film, and (e) forming, in the third chamber, a second film, which is the film containing the predetermined element.

According to the present disclosure, it is possible to improve film properties by protecting a film in a recess from contamination.

DETAILED DESCRIPTION

Figure 1:
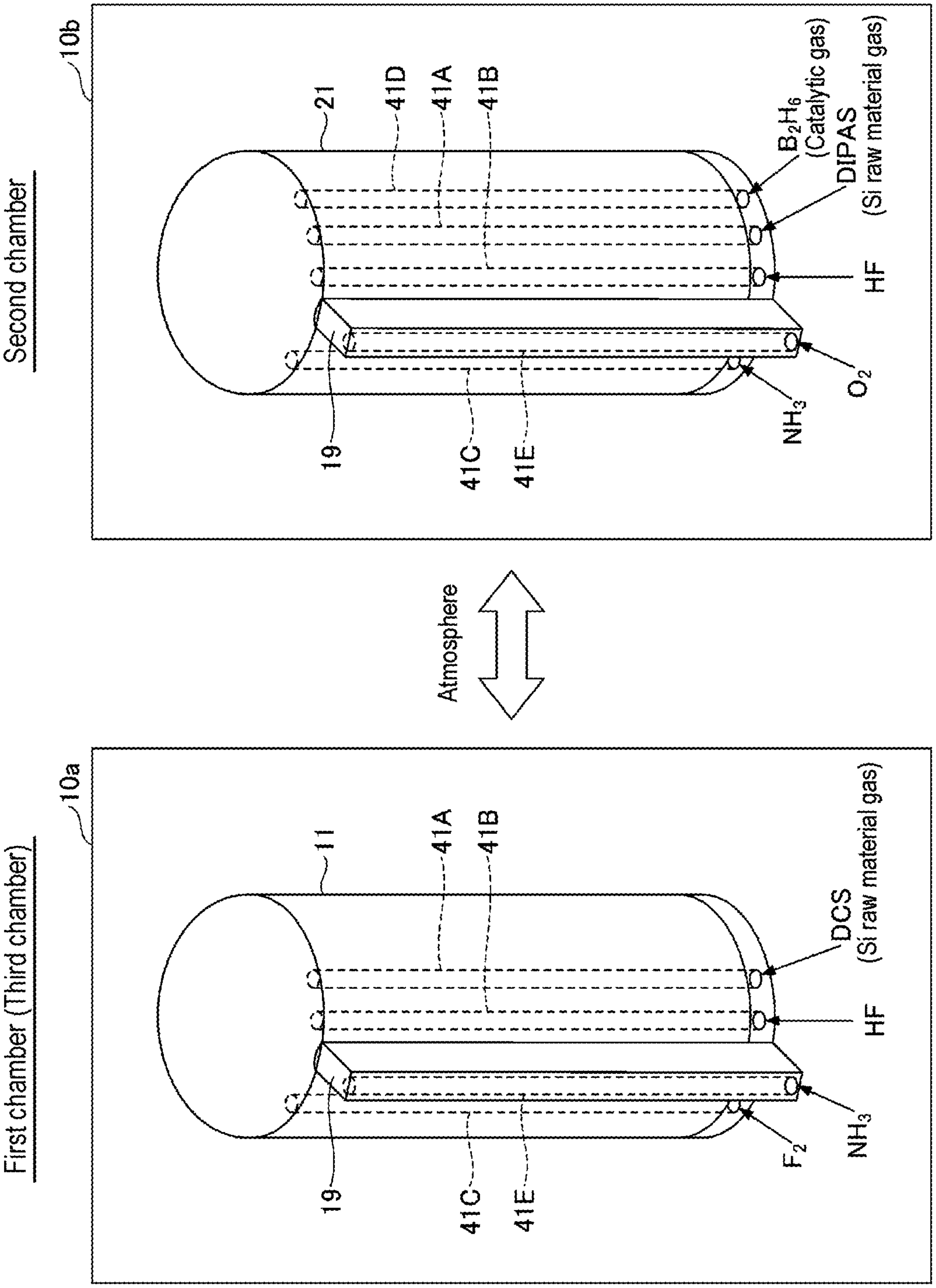
FIG. 1 is a diagram showing an example of a substrate processing system for executing a filling method of a SiN film.

Hereinafter, embodiments for carrying out the present disclosure are described with reference to the drawings. Like reference numerals are given to like or corresponding components throughout the drawings, and repeated description thereof may be omitted.

In the present disclosure, directions such as parallel, right-angled, orthogonal, horizontal, vertical, up and down, and left and right permit deviations to an extent that does not impair the effects of the embodiments. The shape of a corner is not limited to a right angle and may be rounded in an arch shape. The terms “parallel”, “right-angled”, “orthogonal”, “horizontal”, “vertical”, “circular”, and “equal” may include being “substantially parallel”, “substantially right-angled”, “substantially orthogonal”, “substantially horizontal”, “substantially vertical”, “substantially circular”, and “substantially equal”, respectively.

<Substrate Processing System>

Figure 2:
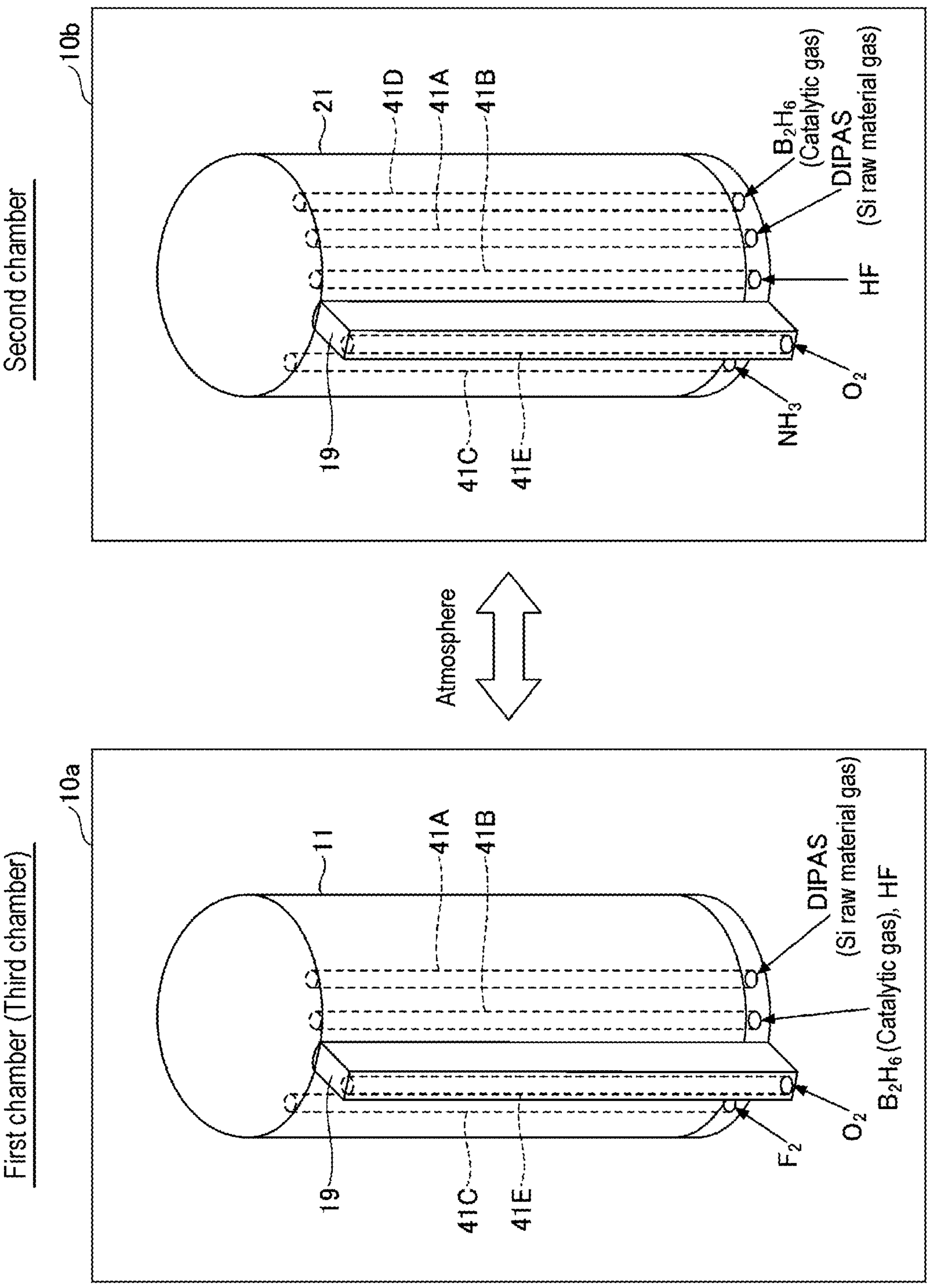
FIG. 2 is a diagram showing an example of a substrate processing system for executing a filling method of a $SiO_2$ film.

An embodiment of a substrate processing system for executing a filling method are described with reference to FIGS. 1 and 2. FIG. 1 is a diagram showing a substrate processing system for executing a filling method of a SiN film. FIG. 2 is a diagram showing an example of a substrate processing system for executing a filling method of a $SiO_2$ film.

The substrate processing system of the embodiment includes a plurality of batch-type substrate processing apparatuses that process a plurality of substrates W simultaneously. In the examples of FIGS. 1 and 2, the substrate processing system includes a substrate processing apparatus 10*a* and a substrate processing apparatus 10*b*. The substrate processing apparatus 10*a* and the substrate processing apparatus 10*b* are different substrate processing apparatuses. The substrate processing apparatus 10*a* and the substrate processing apparatus 10*b* are also collectively referred to as a substrate processing apparatus 10.

The substrate processing apparatuses 10*a* in FIGS. 1 and 2 include a first chamber 11, a plasma box 19, and gas nozzles 41A to 41C, and 41E and perform film formation. The substrate processing apparatuses 10*b* in FIGS. 1 and 2 include a second chamber 21, a plasma box 19, and gas nozzles 41A to 41E, and perform modification and protective film formation. The substrate processing apparatuses 10*a* in FIGS. 1 and 2 have the same structure and supply different gases. The substrate processing apparatuses 10*b* in FIGS. 1 and 2 have the same structure and supply the same gas. When a SiN film is filled in a recess formed on a substrate W, the SiN film is formed by using the substrate processing apparatus 10*a* shown in FIG. 1. When a $SiO_2$ film is filled in the recess formed on the substrate W, the $SiO_2$ film is formed by using the substrate processing apparatus 10*a* shown in FIG. 2. The modification and protective film formation performed in the substrate processing apparatuses 10*b* of FIGS. 1 and 2 are the same process.

<Filling Method ST>

Figure 3:
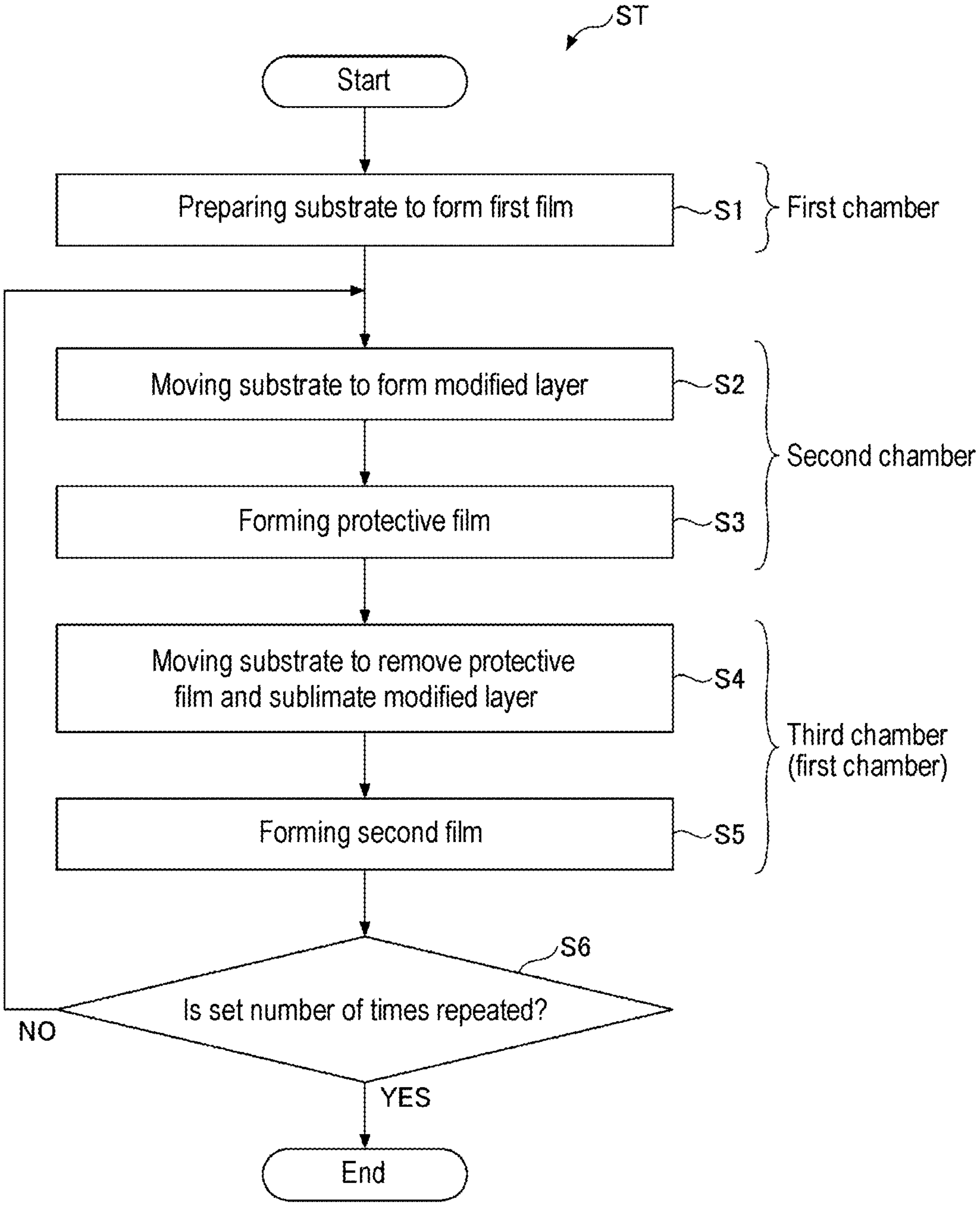
FIG. 3 is a flowchart showing an example of a filling method.

Next, an example of the filling method ST of an embodiment is described with reference to FIGS. 1 to 4E. FIG. 3 is a flowchart showing an example of the filling method ST. FIGS. 4A to 4E are explanatory diagrams of the filling method ST of FIG. 3. The filling method ST of FIG. 3 is controlled by a controller 90, which is described later. When a SiN film is filled in a recess formed on the substrate W, the filling method ST of steps S1 to S6 shown in FIG. 3 is executed by using the substrate processing system of FIG. 1. When a $SiO_2$ film is filled in the recess formed on the substrate W, the filling method ST of steps S1 to S6 shown in FIG. 3 is executed by using the substrate processing system of FIG. 2. First, the filling method ST of the SiN film by using the substrate processing system of FIG. 1 is described.

First, in step S1, the substrate W is prepared in the first chamber 11 of the substrate processing apparatus 10*a*. Although the substrate W that is prepared is not particularly limited, the substrate W has a recess on a semiconductor substrate such as silicon. Next, dichlorosilane (DCS: $SiH_2Cl_2$) gas, which is an example of a Si raw material gas, is supplied from the gas nozzle 41A and ammonia ($NH_3$) gas is supplied from the gas nozzle 41E to form the SiN film in the recess (formation of a first film).

Figure 4A:
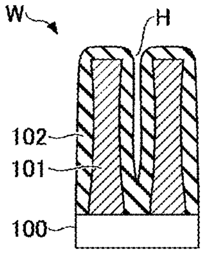
FIGS. 4A to 4E are explanatory diagrams of the filling method of FIG. 3.

FIG. 4A shows an example in which a SiN film 102 is formed on a base film 101 of a recess H formed on a semiconductor substrate 100 such as silicon of the prepared substrate W. The SiN film 102 shown in FIG. 4A is an example of the first film, which is a film containing a predetermined element. In the formation of the first film, a SiN film having an optimal film thickness according to a shape of the recess H is formed. For example, the first film is formed such that an upper portion of the recess H is not blocked.

Further, a substrate having a fine three-dimensional structure on the surface thereof may be used as the substrate W. The fine three-dimensional structure may include a structure in which a fine pattern is formed. The fine pattern has, for example, the recess H shown in FIG. 4A. The recess H is, for example, a trench or a hole. The base film is not particularly limited.

Next, in step S2 of FIG. 3, the substrate W is first taken out of the first chamber 11 of the substrate processing apparatus 10*a* by using a transporter and is transferred to the second chamber 21 of the substrate processing apparatus 10*b*. In this case, the substrate W is exposed to the atmosphere, and a natural oxide film is formed on the SiN film. In the second chamber 21, the SiN film and the natural oxide film formed by the exposure to the atmosphere are exposed to a gas including a halogen-containing gas to thereby form a modified layer. In an embodiment, the gas including the halogen-containing gas may be a halogen-containing gas and a basic gas. The halogen-containing gas may be a gas containing fluorine or chlorine.

Figure 4B:
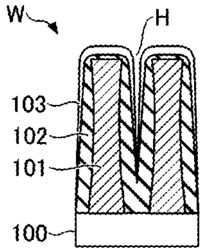

In the example of FIG. 1, hydrogen fluoride (HF) gas is supplied as the halogen-containing gas from the gas nozzle 41B of the second chamber 21, and ammonia ($NH_3$) gas is supplied as the basic gas from the gas nozzle 41C of the second chamber 21. A surface layer of the SiN film is modified (reformed) into a reaction product of ammonium fluorosilicate (AFS: $(NH_4)_2SiF_6$) by the HF gas and $NH_3$ gas. The AFS layer (modified layer) is an intermediate product of etching. As a result, the surface layer of the SiN film 102 is modified to form a modified layer 103 of AFS, as shown in FIG. 4B. Herein, the modified layer 103 of AFS is formed to be thick on an upper side of the recess H and thin on a lower side of the recess H. In other words, the SiN film formed on the upper side of the recess is etched more than the SiN film formed on the lower side.

When an inside of the second chamber 21 is controlled to a temperature at which AFS is sublimated, the modified layer 103 is sublimated and the SiN film is etched. However, in the filling method ST of the present disclosure, the second chamber 21 is controlled to a temperature at which AFS is not sublimated. As a result, step S3 in FIG. 3 is performed in the second chamber 21 without sublimating the modified layer 103.

Figure 4C:
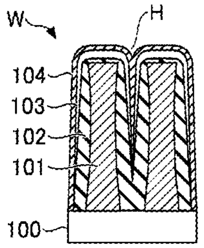

In step S3, a protective film covering the modified layer 103 is formed, in the second chamber 21. In the example of FIG. 1, DIPAS, which is a Si raw material gas, is supplied from the gas nozzle 41A of the second chamber 21, and $O_2$ gas is supplied from the gas nozzle 41E. The $O_2$ gas is formed into plasma in the plasma box 19. A protective film 104 of a $SiO_2$ film is formed on the modified layer 103 by the DIPAS and plasma of $O_2$ gas. In an embodiment, when forming the $SiO_2$ film, $B_2H_6$ gas, which is a catalytic gas, may be supplied from the gas nozzle 41D. When forming the protective film 104, the second chamber 21 is controlled to a temperature at which AFS is not sublimated, for example, below 100 degrees C. Therefore, as shown in FIG. 4C, the SiN film 102 and the modified layer 103 may be protected by the protective film 104 of the $SiO_2$ film without sublimating the modified layer 103 of AFS. Although FIG. 4C shows an example in which the recess H is filled by the protective film 104 (an upper opening of the recess H is blocked), the present disclosure is not limited thereto. The upper portion of the recess H may not be blocked by the protective film 104.

Next, in step S4 of FIG. 3, the substrate W is moved from the second chamber 21 of the substrate processing apparatus 10*b* to a third chamber of a substrate processing apparatus. The third chamber may be the same chamber as the first chamber 11 or may be a different chamber from the first chamber 11. In the following description, the third chamber is described as the same chamber as the first chamber 11. When the substrate W is moved between the chambers, the substrate W is exposed to the atmosphere. However, the modified layer 103 on the substrate W is covered with the protective film 104 of the $SiO_2$ film. Therefore, even if the substrate W is exposed to the atmosphere during the transportation, the SiN film 102 and the modified layer 103 are protected from oxidation or contamination caused by organic substances.

In step S4, the protective film 104 of the $SiO_2$ film is etched in the first chamber 11 by using a halogen-containing gas. When etching the protective film 104, the first chamber 11 is controlled to a temperature at which AFS is sublimated, for example, 100 degrees C. or higher. A difference between a temperature inside the second chamber 21 in step S3 and a temperature inside the first chamber 11 in step S4 may be 150 degrees C. or higher.

Figure 4D:
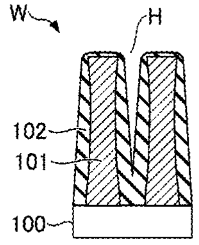

As described above, when the protective film 104 is etched in the first chamber 11, the modified layer 103 is sublimated by heat. In the example of FIG. 1, HF gas is supplied from the gas nozzle 41B of the first chamber 11 and $F_2$ gas is supplied from the gas nozzle 41C to etch the protective film 104 of the $SiO_2$ film. The HF gas and $F_2$ gas are examples of the halogen-containing gas, and at least one selected from the group of HF gas and $F_2$ gas may be supplied. Therefore, as shown in FIG. 4D, the protective film 104 of the $SiO_2$ film and the modified layer 103 are removed (etched). As a result, the SiN film 102 is reduced by an amount of the modification, and the recess H is opened in a V-shape, enabling next film formation while avoiding a void.

Figure 4E:
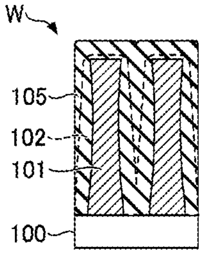

Next, in step S5 of FIG. 3, a subsequent SiN film is formed in the first chamber 11 (formation of a second film). As a result, as shown in FIG. 4E, a SiN film 105 is formed on the SiN film 102 of the substrate W. The SiN film 105 is an example of the second film, which is the film containing the predetermined element. A gas species used to form the SiN film 105 may be the same as a gas species used to form the SiN film 102.

Next, in step S6 of FIG. 3, it is determined whether formation of the second SiN film has been repeated a set number of times. In the example of the embodiment shown in FIGS. 4A to 4E, filling of the recess H is completed by performing steps S1 to S5 once, but depending on a shape of the recess H, step S5 (FIG. 4E) may be performed without blocking the upper portion of the recess H, and steps S2 to S5 may be repeatedly performed. The set number of times in step S6 is predetermined to be the number of times that enables the filling of the recess H while suppressing occurrence of a void or a seam. When the processing of steps S2 to S5 are repeated the set number of times, the filling of the recess H is completed and the processing ends.

In formation of the SiN film, if the film is formed thicker on the upper side of the recess than the lower side of the recess, the upper opening of the recess may be blocked and an air gap (void) may occur inside the recess during the film formation. In this case, if etching is performed between first film formation and second film formation of the SiN film, and thus a film formed on the upper side of the recess is removed more than a film formed on the lower side of the recess, it is possible to form the SiN film in the recess without a void during the second film formation.

In this way, when forming the film containing the predetermined element, such as a silicon-containing film or a metal-containing film, in the recess on the substrate W, generation of voids may be avoided and a desired film may be filled in a fine recess by repeating the film formation and the etching. In such a filling method, the film formation and the etching may be performed in separate chambers or may be consecutively performed in the same chamber.

When performing the film formation and the etching consecutively in the same chamber, contamination of the substrate W in the atmosphere may be avoided. However, in this case, if there is a significant difference between a temperature condition for the film formation and a temperature condition for the etching, time required for temperature control in the chamber increases, thereby lowering productivity. Therefore, in the filling method performed in the same chamber, there are restrictions on the temperature conditions in consideration of the decrease in productivity.

In the filling method ST of the present disclosure, since the film formation and the etching are performed in separate chambers, even if a difference between a film formation temperature and an etching temperature is large, insides of the respective chambers may be controlled to different temperatures. As a result, the temperature condition for the film formation and the temperature condition for the etching may be freely set without constraints while maintaining the productivity.

However, the substrate W is exposed to the atmosphere every time the substrate W is transported between the chambers. As a result, a film formed on the substrate W is oxidized by oxygen in the atmosphere to form an oxide film, or organic substances in the atmosphere adhere to the film and contaminate the film. Therefore, properties of the film formed are deteriorated. As such, it is necessary to avoid formation of the oxide film or contamination on a surface of the substrate W.

According to the filling method ST of the present disclosure, the natural oxide film on the SiN film formed when the substrate W is moved from the first chamber 11 to the second chamber 21 is modified to AFS (modified layer 103). Moreover, before the substrate W is moved from the second chamber 21 to the first chamber 11, the modified layer 103 is covered with the protective film 104. This allows the protective film 104 on the surface of the substrate W to protect the modified layer 103 and the SiN film 102 from contamination in the atmosphere during the transportation of the substrate W. As a result, it is possible to prevent surfaces of the modified layer 103 and the SiN film 102 from being oxidized to form the oxide film or from being contaminated by organic substances. Although AFS (modified layer 103) is a thermally sublimable material, AFS is coated with the protective film 104 of the $SiO_2$ film, and as a result, it is possible to transfer the substrate W from the second chamber 21 to the first chamber 11 in a stable state without being volatilized during the transportation of the substrate W.

After the substrate W is transported to the first chamber 11, the protective film 104 and the modified layer 103 are removed in the first chamber 11, and a new SiN film is subsequently formed on the surface of the uncontaminated SiN film in the same chamber. As a result, a high-quality SiN film that does not contain the natural oxide film or contaminants at an interface between the initial SiN film and the subsequent SiN film may be filled in the recess.

In the substrate system of FIG. 2, a $SiO_2$ film is filled in the recess H of the substrate W. In this case, in step S1 of FIG. 3, the $SiO_2$ film is formed in the substrate processing apparatus 10*a* (formation of a first film). As a gas species used, as shown in FIG. 2, DIPAS, which is a Si raw material gas, is supplied from the gas nozzle 41A and $O_2$ gas is supplied from the gas nozzle 41E, in the first chamber 11 of the substrate processing apparatus 10*a*, to form the $SiO_2$ film in the recess. In an embodiment, during the formation of the $SiO_2$ film, $B_2H_6$ gas, which is a catalytic gas, may be supplied from the gas nozzle 41B. Processes performed in steps S2 and S3 in FIG. 3 are the same as the processes described above, and therefore a description thereof is omitted.

After the substrate W is transported to the first chamber 11, in step S4 in FIG. 3, the protective film 104 and the modified layer 103 formed in steps S2 and S3 are removed in the first chamber 11. Next, in step S5, in the same chamber, a $SiO_2$ film is further formed on the uncontaminated $SiO_2$ film (formation of a second film). As a result of repeating the processes of steps S2 to S5 a set number of times, in the formation of the initial $SiO_2$ film and the subsequent $SiO_2$ film, a high-quality $SiO_2$ film that does not contain the natural oxide film or contaminants at an interface between the initial $SiO_2$ film and the subsequent $SiO_2$ film may be filled in the recess.

Hereinabove, the method of filling the SiN film and the $SiO_2$ film has been described. Formation of the SiN film and the $SiO_2$ film in the recess (steps S1 and S5) may be performed by an atomic layer deposition (ALD) method, which is a method of forming a film by alternately supplying a raw material gas and a reactive gas. A chemical vapor deposition (CVD) method of forming a film by simultaneously supplying the raw material gas and the reactive gas may be used. For the film formation of the $SiO_2$ film as the protective film 104 (step S3), any of the ALD method and the CVD method may be used. Film formation of the SiN film by the ALD method (see FIGS. 8 and 9) and film formation of the $SiO_2$ film by the ALD method (see FIGS. 10 and 11) are described later.

<Process Conditions>

Figure 5:
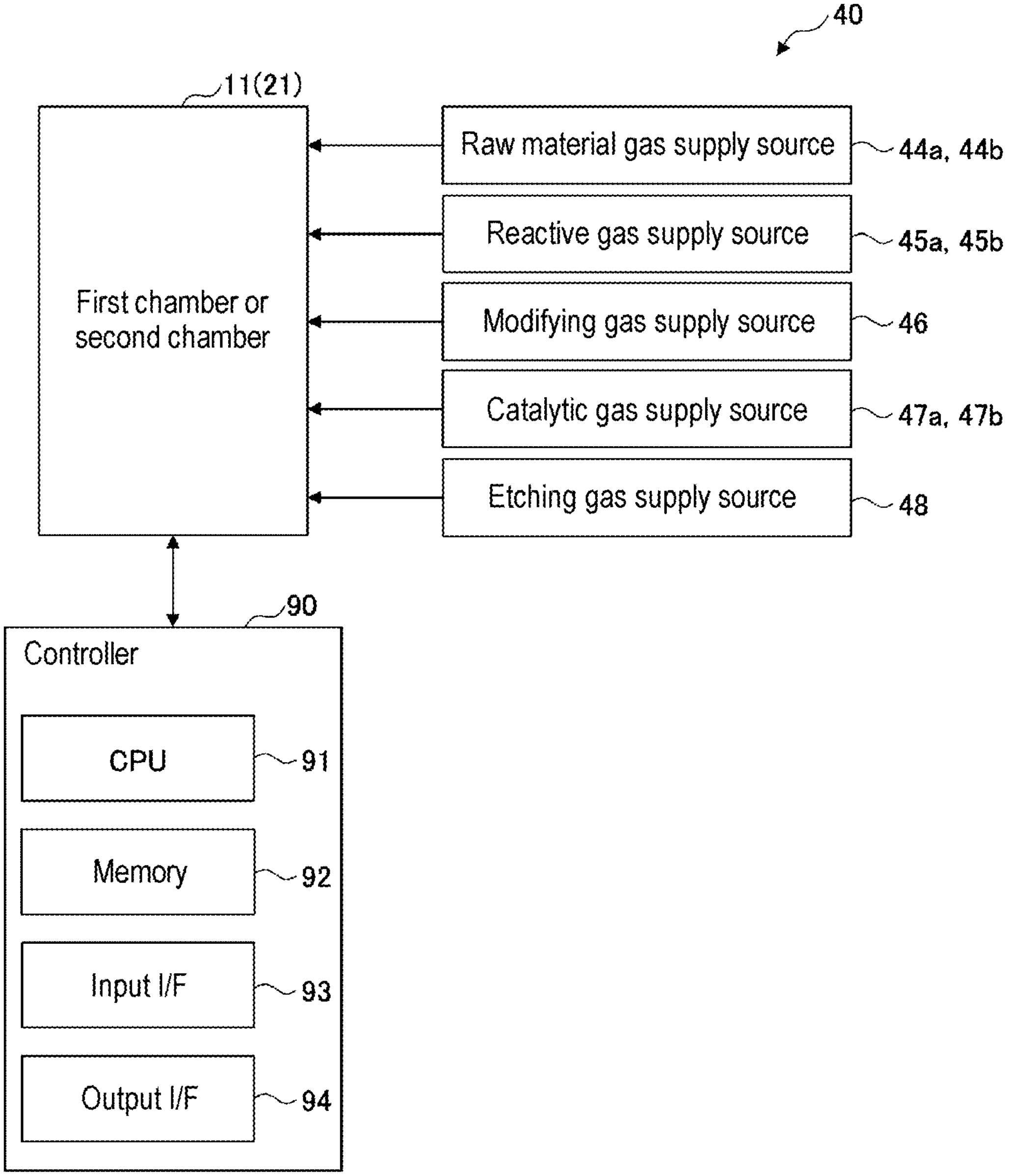
FIG. 5 is an explanatory diagram of gas supply sources and a controller of the substrate processing system.

Process conditions of the filling method ST of the present disclosure are described with reference to FIG. 5. FIG. 5 is an explanatory diagram of various gas supply sources for supplying various gases to the first chamber 11 or the second chamber 21 and of a controller 90.

A gas supplier of the substrate processing apparatus 10*a* includes a raw material gas supply source 44*a*, a reactive gas supply source 45*a*, a catalytic gas supply source 47*a*, and an etching gas supply source 48, and the gas supply sources are connected to the first chamber 11 to supply various gases into the first chamber 11. A gas supplier of the substrate processing apparatus 10*b* includes a raw material gas supply source 44*b*, a reactive gas supply source 45*b*, a modifying gas supply source 46, a catalytic gas supply source 47*b*, and an etching gas supply source 48, and the gas supply sources are connected to the second chamber 21 to supply various gases into the second chamber 21. Gas flow rate control valves are provided on gas pipes connecting the first chamber 11 and each of the gas supply sources and gas pipes connecting the second chamber 21 and each of the gas supply sources to control a flow rate of each gas by control of the controller 90.

<Film Formation Conditions (Gas Species): Steps S1 and S5 in FIG. 3>

First, process conditions (gas species) for the film formation performed in steps S1 and S5 in FIG. 3 are described in order of (1) filling the SiN film in the recess and (2) filling the $SiO_2$ film in the recess.

(1) Filling SiN Film in Recess

The raw material gas supply source 44*a* is connected to the gas nozzle 41A in the first chamber 11 in FIG. 1 and supplies a raw material gas into the first chamber 11 from a plurality of gas holes 42A (see FIG. 6) described later. In formation of a film containing a predetermined element, the raw material gas includes the predetermined element. When the predetermined element is silicon, the raw material gas is a Si raw material gas including silicon.

As the Si raw material gas supplied to the first chamber 11, the Si raw material gas of the embodiment is DCS gas, but the technique of the present disclosure is not limited thereto. As the Si raw material gas, in addition to DCS gas, monochlorosilane (MCS: $SiH_3Cl$) gas, trichlorosilane (TCS: $SiHCl_3$) gas, silicon tetrachloride (STC: $SiCl_4$) gas, hexachlorodisilane (HCDS: $Si_2Cl_6$) gas, or gas including any of these gases may be used. By supplying these gases to the substrate W, a layer including silicon (Si) (Si-containing layer) may be formed on the substrate W. A gas including a halogen element (e.g., $BCl_3$ gas) may be supplied together with the Si raw material gas.

The reactive gas supply source 45*a* is connected to the gas nozzle 41E in the first chamber 11 in FIG. 1 and supplies a reactive gas (nitriding gas) into the plasma box 19 from a plurality of gas holes 42E (see FIG. 6) described later. The reactive gas (nitriding gas) is formed into plasma in the plasma box 19 and supplied into the first chamber 11 to nitride the Si-containing layer.

As the reactive gas, the reactive gas of the embodiment is $NH_3$ gas, but the technique of the present disclosure is not limited thereto. As the reactive gas, hydrogen ($H_2$) gas, hydrazine ($N_2H_4$) gas, or gas including any of these gases may be used together with $NH_3$ gas. In addition, boron (B) gas, oxygen ($O_2$) gas, etc. may be further added as a doping gas to these gases.

As the reactive gas, in addition to $NH_3$ gas, an organic hydrazine compound gas, an amine-based gas, NO gas, $N_2O$ gas, $NO_2$ gas, or gas including any of these gases may be used. As the organic hydrazine compound gas, for example, hydrazine ($N_2H_4$) gas, diazene ($N_2H_2$) gas, or monomethylhydrazine (MMH) gas is used. As the amine-based gas, for example, monomethylamine gas is used.

(2) Filling $SiO_2$ Film in Recess

The raw material gas supply source 44*a* is connected to the gas nozzle 41A in the first chamber 11 in FIG. 2 and supplies a raw material gas into the first chamber 11 from the plurality of gas holes 42A (see FIG. 6) described later. In formation of a film containing a predetermined element, the raw material gas includes the predetermined element. When the predetermined element is silicon, the raw material gas is a Si raw material gas including silicon.

As the Si raw material gas supplied to the first chamber 11, the Si raw material gas in the embodiment is diisopropylaminosilane (DIPAS) gas (see the first chamber 11 in FIG. 2), but the technique of the present disclosure is not limited thereto. As the Si raw material gas, aminosilane-based gas, chlorosilane-based gas, or silanol-based gas may be used. As the aminosilane-based gas, in addition to DIPAS gas, dimethylaminosilane (DMAS) gas, bisdimethylaminosilane (BDMAS) gas, trisdimethylaminosilane (3DMAS) gas, bis tert-butylaminosilane (BTBAS) gas, diethylaminosilane (DEAS) gas, bisdiethylaminosilane (BDEAS) gas, and dipropylaminosilane (DPAS) gas, or gas including any of these gases may be used.

As the chlorosilane-based gas, hexachlorodisilane (HCDS: $Si_2Cl_6$) gas, monochlorosilane (MCS: $SiH_3Cl$) gas, trichlorosilane (TCS: $SiHCl_3$) gas, silicon tetrachloride (STC: $SiCl_4$) gas, or gas including any of these gases may be used. As the silanol-based gas, tris (tert-pentoxy) silanol gas, triethylsilanol gas, methylbis (tert-pentoxy) silanol gas, and tris (tert-butoxy) silanol gas may be used. By supplying these gases to the substrate W, a Si-containing layer may be formed on the substrate W.

The reactive gas supply source 45*a* is connected to the gas nozzle 41E in the first chamber 11 in FIG. 1 and supplies a reactive gas (oxidizing gas) into the plasma box 19 from the plurality of gas holes 42E (see FIG. 6) described later. The reactive gas (oxidizing gas) is formed into plasma in the plasma box 19 and supplied into the first chamber 11 to oxidize the Si-containing layer.

As the reactive gas, the reactive gas of the embodiment is $O_2$ gas, but the technique of the present disclosure is not limited thereto. As a reactive gas reacting with the aminosilane-based gas (DIPAS, 3DMAS, BTBAS, BDEAS gas, etc.), $H_2O$ gas, $O_2$ gas, and/or ozone ($O_3$) gas may be used. As a reactive gas reacting with the chlorosilane gas (HCDS gas, etc.), $H_2O$ gas and pyridine ($C_5H_5N$) may be supplied. As a reactive gas reacting with the silanol-based gas (tris (tert-pentoxy) silanol gas, etc.), $H_2O$ gas, $O_2$ gas, and/or ozone ($O_3$) gas may be used. As a doping gas, a boron (B)-containing gas, an oxygen (O)-containing gas, a nitrogen (N)-containing gas, a carbon (C)-containing gas, or the like may be added to these gases. Furthermore, as the catalytic gas from the catalytic gas supply source 47*a*, a catalytic gas such as trimethylaluminum (TMA) gas, triethylborane (TEB) gas, or diborane ($B_2H_6$) gas may be supplied. When the silanol-based gas is used as the raw material gas, the $SiO_2$ film may be formed without using the reactive gas by using the catalytic gas. In the first chamber 11 shown in FIG. 2, $B_2H_6$ gas, which is the catalytic gas, may be supplied during the formation of the $SiO_2$ film. The catalytic gas supply source 47*a* is connected to the gas nozzle 41B in the first chamber 11 in FIG. 2 and supplies the catalytic gas from a plurality of gas holes 42B (see FIG. 6) described later into the first chamber 11. Herein, the catalytic gas may not be supplied.

<Modification Conditions and Protective Film Formation Conditions (Gas Species): Steps S2 and S3 in FIG. 3>

Next, process conditions (gas species) during the modification performed in step S2 and during the formation of the protective film performed in step S3 of FIG. 3 are described. The modifying gas supply source 46 shown in FIG. 5 is connected to the gas nozzles 41B and 41C in the second chamber 21 in FIGS. 1 and 2 and supplies the modifying gas into the second chamber 21 from the plurality of gas holes 42B and 42C (see FIG. 6) described later. As a result, the SiN film or the $SiO_2$ film is modified.

As the modifying gas, the modifying gas of the embodiment is $NH_3$ gas and HF gas (see the second chamber 21 in FIGS. 1 and 2), but the technique of the present disclosure is not limited thereto. As the modifying gas, in addition to $NH_3$ gas and HF gas, $F_2$ gas and $NF_3$ gas may be used. When $NF_3$ gas is used, $NF_3$ gas may be formed into plasma in the plasma box 19 and supplied into the second chamber 21.

When forming the protective film, the raw material gas supply source 44*b* supplies the Si raw material gas into the second chamber 21. As the Si raw material gas supplied to the second chamber 21, the Si raw material gas of the embodiment is diisopropylaminosilane (DIPAS) gas (see the second chamber 21 in FIGS. 1 and 2), but the technique of the present disclosure is not limited thereto. The Si raw material gas may be the same gas as the Si raw material gas supplied from the raw material gas supply source 44*a*.

The reactive gas supply source 45*b* supplies a reactive gas (oxidizing gas) into the second chamber 21 to oxidize the Si-containing layer. As the reactive gas (oxidizing gas), the reactive gas of the embodiment, is $O_2$ gas, but the technique of the present disclosure is not limited thereto. The reactive gas may be the same as the oxidizing gas supplied from the reactive gas supply source 45*a*.

<Etching Conditions and Film Formation Conditions (Gas Species): Steps S4 and S5 in FIG. 3>

Next, process conditions (gas species) during the removal of the protective film performed in step S4 and the film formation performed in step S5 of FIG. 3 are described. The etching gas supply source 48 shown in FIG. 5 is connected to the gas nozzle 41C in the first chamber 11 in FIGS. 1 and 2 and the gas nozzle 41B in the first chamber 11 in FIGS. 1 and 2 and supplies the etching gas into the first chamber 11 from the plurality of gas holes 42B and 42C (see FIG. 6) described later. Therefore, the protective film is etched.

A gas for etching the protective film is a halogen-containing gas. As the etching gas, the etching gas of the embodiment is $F_2$ gas and HF gas (see the first chamber 11 in FIGS. 1 and 2), but the technique of the present disclosure is not limited thereto. The etching gas may be a fluorine-containing gas such as $F_2$ gas, HF gas, $ClF_3$ gas, $NF_3$ gas, or a combination thereof.

The etching conditions are desirably such that the $SiO_2$ film as the protective film is easily etched and the SiN film or the $SiO_2$ film to be filled is not easily etched, but the technique of the present disclosure is not limited thereto. For example, the $SiO_2$ film as the protective film formed in the second chamber 21 is formed at a low temperature and has a low film quality, so the $SiO_2$ film as the protective film is more easily etched than the SiN film or $SiO_2$ film to be filled.

When the protective film is etched, the modified layer of AFS is thermally sublimated. In this way, the protective film, and AFS (modified layer), which is the intermediate of etching, are removed. After removing the protective film and the modified layer, in step S5 of FIG. 3, the second film of the same film type as the SiN film or $SiO_2$ film formed in step S1 is formed. The film formation conditions may be the same as or different from the conditions described in step S1 of FIG. 3.

In addition, the example has been described in which the plasma of $NH_3$ gas is generated in the plasma box 19 in the first chamber 11 during the formation of the SiN film. Furthermore, the example has been described in which the plasma of $O_2$ gas is generated in the plasma box 19 in the second chamber during the formation of the $SiO_2$ film of the protective film. However, the plasma box 19 may not be required. In the case in which the Si-containing film is nitrided by heat treatment, the case in which the Si-containing film is nitrided only by thermal energy using a hydrazine-based gas instead of ammonia, or the case in which $O_3$ gas is used to form the $SiO_2$ film, the plasma box 19 may not be required in the substrate processing apparatus 10.

A purge gas supply source, which is not shown, may be provided. By supplying a purge gas into the first chamber 11 and the second chamber, a gas remaining in the first chamber 11 and the second chamber is removed. The purge gas is, for example, an inert gas. As the inert gas, a noble gas, such as Ar gas, or $N_2$ gas is used.

$F_2$ gas and HF gas supplied to the first chamber 11 in FIG. 1, $F_2$ gas and HF gas supplied to the first chamber 11 in FIG. 2, and HF gas supplied to the second chamber 21 in FIGS. 1 and 2 may also be used as cleaning gases for cleaning each chamber.

<Process Conditions (Temperature): Steps S1 to S5 in FIG. 3>

Next, process conditions (temperature) of steps S1 to S5 in FIG. 3 are described. In the filling method ST of the present disclosure, the modification and protective film formation (steps S2 and S3) in the second chamber 21 are performed at a lower temperature range than a temperature at which the film formation (steps S1 and S5) and etching (step S4) are performed in the first chamber 11. Hereinbelow, the SiN film is used as a target to be filled, but the same temperature control is performed even when the $SiO_2$ film or other films are filled.

In step S1, the inside of the first chamber 11 is controlled to a temperature equal to or higher than 100 degrees C. (desirably 250 to 700 degrees C.), and the substrate W is heated to 100 degrees C. or higher to form the SiN film. In step S2, the inside of the second chamber 21 is controlled to a temperature less than 100 degrees C., and HF gas and $NH_3$ gas are supplied to the surface of the SiN film to form AFS (modified layer). In this case, a portion of the SiN film is modified and introduced into the modified layer.

In step S3, the protective film of the $SiO_2$ film is formed while the inside of the second chamber 21 is controlled to a temperature less than 100 degrees C. For example, when the $SiO_2$ film is formed using the Si raw material gas of DIPAS and $O_2$ radicals in $O_2$ plasma, it is possible to cause a reaction between the Si raw material gas and the $O_2$ radicals at room temperature.

In forming the protective film of the $SiO_2$ film after the modification, the same temperature range as a temperature during the modification is used, but the temperatures during the film formation and the modification may not be the same temperature if AFS is not sublimated. Therefore, the temperature inside the second chamber 21 is in a range of 25 degrees C. to less than 100 degrees C. (e.g., 70 degrees C.) at which AFS is not sublimated. In order to enable the film formation in such a temperature range, a catalytic gas is added as necessary, so that the $SiO_2$ film may be formed in a state in which the inside of the second chamber 21 is controlled to a temperature less than 100 degrees C.

In step S4, the inside of the first chamber 11 is controlled to a temperature equal to or higher than 100 degrees C. (desirably 250 degrees C. to 700 degrees C.), and the substrate W is heated to 100 degrees C. or higher. Then, the protective film of the $SiO_2$ film is etched by the etching gas, and at the same time, the modified layer of AFS is volatilized and removed. In step S5 after step S4, the inside of the first chamber 11 is continuously controlled to a temperature equal to or higher than 100 degrees C., and the substrate W is heated to 100 degrees C. or higher to form the SiN film.

The temperature of the first chamber 11 is maintained in a temperature range of 250 degrees C. to 700 degrees C. (e.g., 550 degrees C.). Therefore, if the modified layer of AFS is not coated with the protective film, thermal sublimation of AFS occurs when the substrate W is transferred to the first chamber 11, and AFS, which has been vaporized, diffuses not only into the first chamber 11 but also into a transfer module, thereby causing contamination.

Furthermore, in order to sublimate the modified layer of AFS in the second chamber 21, it is necessary to raise the temperature inside the second chamber 21 to a sublimation temperature of AFS. In order to eliminate such time loss, the filling method ST of the present disclosure performs the sublimation of AFS in the first chamber 11.

That is, in the filling method ST of the present disclosure, after forming the modified layer of AFS in the second chamber 21 in which the temperature is controlled to less than 100 degrees C., the substrate W is transferred to the first chamber 11 in a state in which the modified layer of AFS is capped with the protective film of the $SiO_2$ film by the film formation at a low temperature less than 100 degrees C. in the same chamber. This makes it possible to prevent the modified layer of AFS from being sublimated even if heat is applied during the transportation of the substrate W to the first chamber 11.

After the substrate W is transferred to the first chamber 11, the protective film of the $SiO_2$ film capping the modified layer of AFS is removed before the next SiN film is formed. This $SiO_2$ film is removed at a processing temperature near a film formation temperature range of the SiN film. At the same time as the protective film of the $SiO_2$ film is removed, the modified layer of AFS is sublimated by heat.

As a result, when the film formation and the etching are performed in separate chambers, it is possible to deposit the SiN films without generating an oxide film or contamination at an interface therebetween in formation of the first and second films. Furthermore, when the filling method is performed consecutively in the same chamber, each step requires a wide range of temperature increases and decreases in processing temperatures. In the filling method ST of the present disclosure, each processing of the filling method is performed using separate chambers, such that time is not required for temperature control and a film with good-quality film properties may be formed in a short time.

As shown in FIG. 5, the substrate processing apparatus 10 includes the controller 90 that controls the substrate processing apparatus 10. The controller 90 is, for example, composed of a computer, and includes a central processing unit (CPU) 91 and a memory 92. The memory 92 stores programs that control various processes performed in the substrate processing apparatus 10. The controller 90 controls operations of the substrate processing apparatus 10 by causing the CPU 91 to execute recipes and programs that set the process conditions stored in the memory 92. The controller 90 also includes an input interface (I/F) 93 and an output I/F 94. The controller 90 receives signals from the outside through the input I/F 93 and transmits signals to the outside through the output I/F 94.

Such recipes and programs may have been stored in a non-transient computer-readable medium and may be installed from the medium into the memory 92 of the controller 90. The computer-readable medium includes, for example, a hard disk (HD), a flexible disk (FD), a compact disc (CD), a magneto-optical (MO) disc, a memory card, and the like. The recipes and programs may be downloaded from a server via the Internet and installed in the memory 92 of the controller 90.

<Film Species>

The film species to be filled in the recess is not limited to the SiN film and the $SiO_2$ film and may be any film containing a predetermined element. The predetermined element is any of Si, germanium (Ge), or a metal. When the predetermined element is Si, the film containing the predetermined element may be a silicon film, a silicon-containing oxide film, or a silicon-containing nitride film. For example, the film containing the predetermined element may be a Si film, a SiN film, a SiON film, a SiCN film, a SiOCN film, a SiBN film, a SiBCN film, and a SiFN film.

When the predetermined element is a metal, the metal is any of titanium (Ti), aluminum (Al), or tungsten (W). In this case, the film containing the predetermined element may be a metal film of Ti, Al, or W, or an oxide film and a nitride film of such a metal.

The protective film is not limited to the $SiO_2$ film. The protective film may be an oxide film of the film containing the predetermined element.

<Substrate Processing Apparatus>

Figure 6:
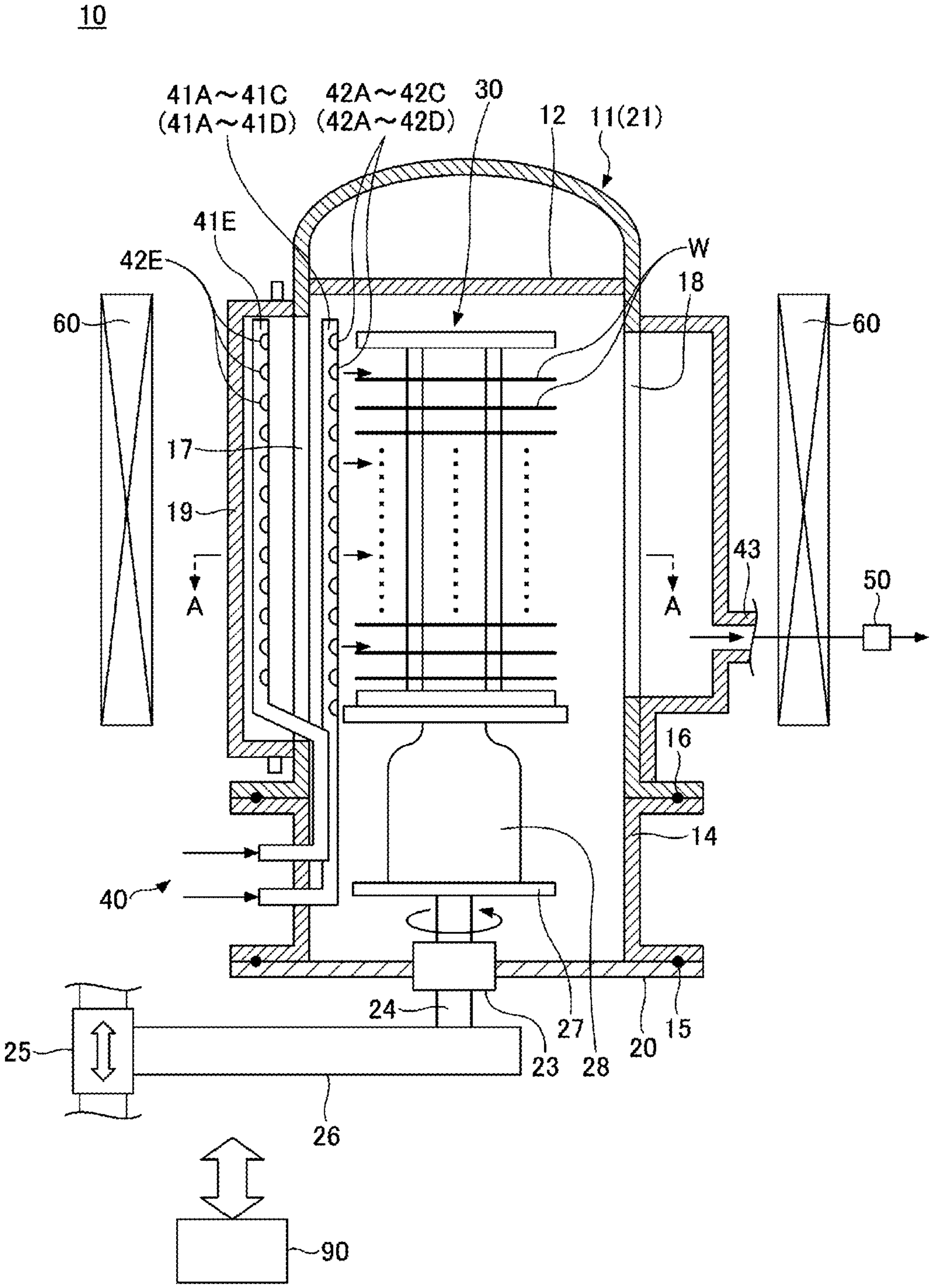
FIG. 6 is a diagram showing an example of a substrate processing apparatus.

Next, the substrate processing apparatus 10 capable of performing the filling method ST according to the embodiment is described with reference to FIGS. 6 and 7. FIG. 6 is a diagram showing an example of the substrate processing apparatus 10 according to the embodiment, and FIG. 7 is a cross-sectional view taken along arrow line A-A in FIG. 6.

When the substrate processing apparatus 10 is the substrate processing apparatus 10*a*, the substrate processing apparatus 10*a* includes a first chamber 11, a gas supplier 40, an exhauster 50, a heater 60, and a controller 90. The gas supplier 40 of the substrate processing apparatus 10*a* includes four gas nozzles 41A to 41C, and 41E. The gas nozzles 41A to 41C, and 41E include a plurality of gas holes 42A to 42C, and 42E.

When the substrate processing apparatus 10 is the substrate processing apparatus 10*b*, the substrate processing apparatus 10*b* includes a second chamber 21, the gas supplier 40, the exhauster 50, the heater 60, and the controller 90. The gas supplier 40 of the substrate processing apparatus 10*b* includes five gas nozzles 41A to 41E. The gas nozzles 41A to 41E include a plurality of gas holes 42A to 42E.

Figure 7:
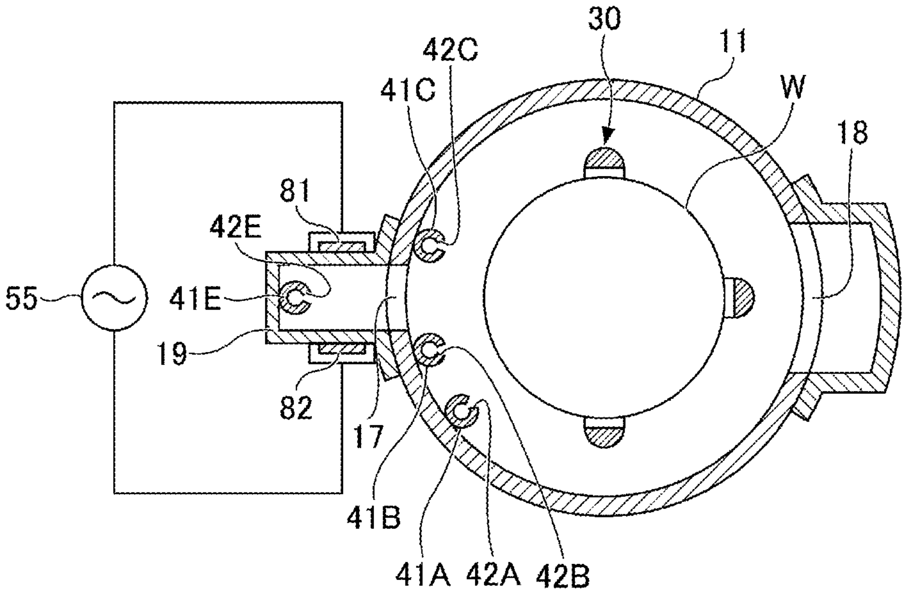
FIG. 7 is a cross-sectional view taken along arrow line A-A in FIG. 6.

FIG. 7 shows the configuration of the substrate processing apparatus 10*a* including the four gas nozzles 41A to 41C, and 41E. The other configurations are the same between the substrate processing apparatus 10*a* and the substrate processing apparatus 10*b*, so the configuration of the substrate processing apparatus 10*a* is described below as the substrate processing apparatus 10.

A ceiling plate 12 is provided near an upper end of the first chamber 11, and a lower region of the ceiling plate 12 is sealed. The first chamber 11 and the ceiling plate 12 are formed of, for example, quartz, and accommodate a substrate holder 30. A metallic manifold 14 formed in a cylindrical shape is connected to a lower end opening of the first chamber 11 via a seal member 16 such as an O-ring. The manifold 14 supports a lower end of the first chamber 11, and the substrate holder 30 is inserted into the first chamber 11 from below the manifold 14.

The substrate holder 30 holds a plurality (e.g., 25 to 150 sheets) of substrates W, such as semiconductor wafers, in a shelf-like configuration. The substrate holder 30 is made of, for example, quartz. The substrate holder 30 supports the plurality of substrates W by using three supports. The substrate holder 30 is placed above a table 27 via a heat-retaining tube 28 made of quartz. The heat-retaining tube 28 suppresses a decrease in a temperature inside the first chamber 11 caused by heat radiation from a lower side of the first chamber 11. The table 27 is supported on a rotating shaft 24. The rotating shaft 24 passes through a metal (e.g., stainless steel) lid 20 that opens and closes a lower end opening of the manifold 14.

A magnetic fluid seal 23 is provided at a penetration portion of the rotating shaft 24. The magnetic fluid seal 23 hermetically seals the rotating shaft 24 and rotatably supports the rotating shaft 24. A seal member 15, such as an O-ring, is provided between a periphery of the lid 20 and a lower end of the manifold 14 to maintain airtightness in the first chamber 11. The rotating shaft 24 is attached to a tip of an arm 26 supported by a lift 25 such as a boat elevator. When the arm 26 is raised and lowered, the substrate holder 30 and the lid 20 are integrally raised and lowered and are inserted into or separated from the first chamber 11.

The plasma box 19 is provided at a portion of a side wall of the first chamber 11. In the example of FIG. 7, the gas nozzles 41A to 41C are disposed in the first chamber 11, and the gas nozzle 41E is disposed in the plasma box 19.

The gas nozzles 41A to 41C and 41E are formed of, for example, quartz. The gas nozzles 41A to 41C penetrate a side wall of the manifold 14 inwardly so as to bend upward and extend vertically. Base ends of the gas nozzles 41A to 41C are located outside the first chamber 11 and connected to any of the gas supply sources shown in FIG. 5. Vertical portions of the gas nozzles 41A to 41C are located inside the first chamber 11. The vertical portions of the gas nozzles 41A to 41C include the plurality of gas holes 42A to 42C formed at predetermined intervals over a vertical length corresponding to a substrate support range of the substrate holder 30. The gas nozzles 41A to 41C horizontally eject raw material gases, examples of which are shown in FIG. 1 or 2, or the like from the gas supply sources through the gas pipes into the first chamber 11 from the plurality of gas holes 42A to 42C.

The gas nozzle 41E penetrates the side wall of the manifold 14 inwardly so as to bend upward and extend vertically. A base end of the gas nozzle 41E is located outside the first chamber 11 and is connected to a gas supply source. A vertical portion of the gas nozzle 41E is located inside the plasma box 19. The vertical portion of the gas nozzle 41E includes the plurality of gas holes 42E formed at predetermined intervals over a vertical length corresponding to the substrate support range of the substrate holder 30. The gas nozzle 41E horizontally ejects gases, introduced from the gas supply source through the gas pipe and whose examples are shown in FIG. 1 or 2, from the plurality of gas holes 42E into the plasma box 19.

An opening 17 is formed at a portion of the first chamber 11 in a circumferential direction. The plasma box 19 is formed on a side surface of the first chamber 11 so as to surround the opening 17. As shown in FIG. 7, a pair of electrodes 81 and 82 is disposed such that the plasma box 19 is disposed therebetween. The electrodes 81 and 82 are a pair of parallel electrodes that are placed to face each other on an outer side of the plasma box 19. The electrodes 81 and 82 are connected to an RF power source 55, and a radio-frequency voltage is applied from the RF power source 55 thereto.

Referring back to FIG. 6, the exhauster 50 includes a vacuum pump and exhausts the inside of the first chamber 11. An exhaust port 18 is formed at the first chamber 11, and gases in the first chamber 11 pass through the exhaust port 18 and is then exhausted from an exhaust pipe 43.

The heater 60 is disposed outside the first chamber 11 and heats the inside of the first chamber 11. For example, the heater 60 is formed in a cylindrical shape so as to surround the first chamber 11. The heater 60 is composed of, for example, an electric heater. The heater 60 heats the inside of the first chamber 11, thereby improving processing capability of gases supplied into the first chamber 11.

<SiN Film Formation Method>

Figure 8:
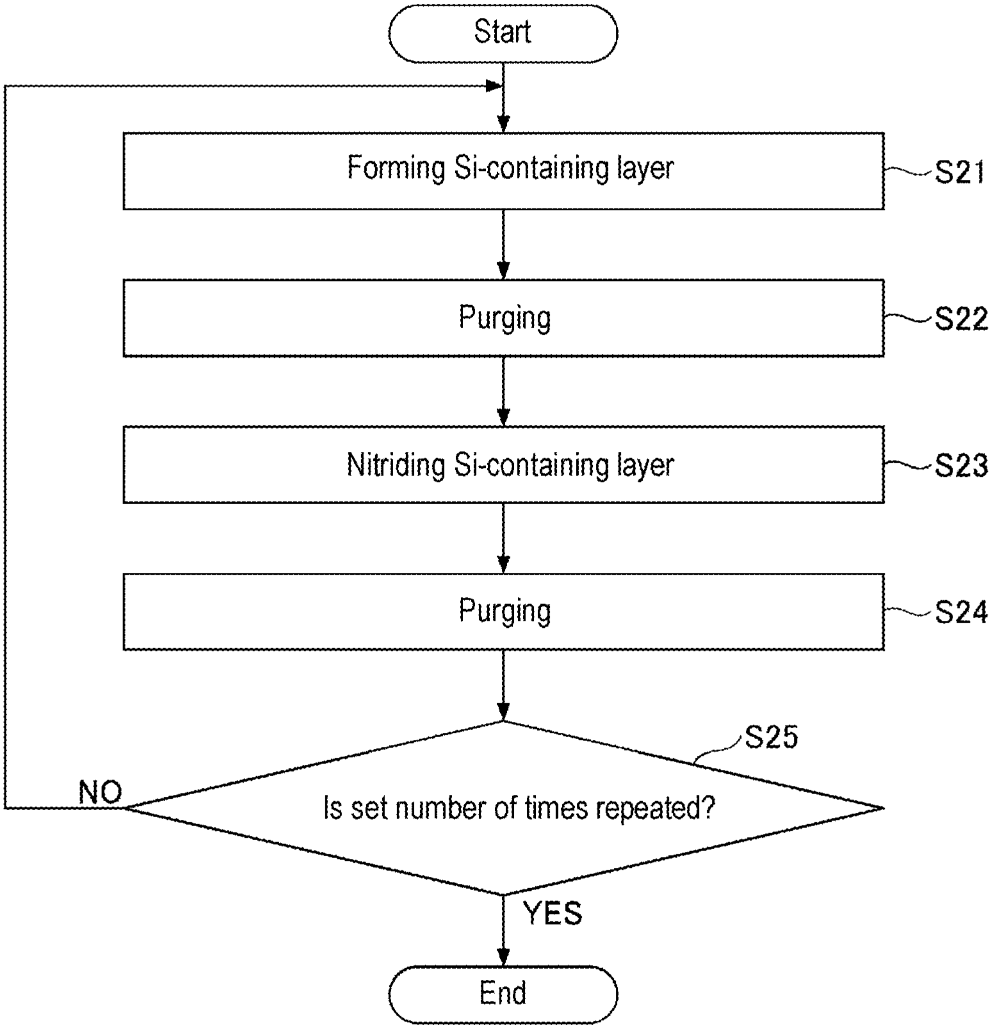
FIG. 8 is a flowchart showing an example of a film formation method of a SiN film.
Figure 9:
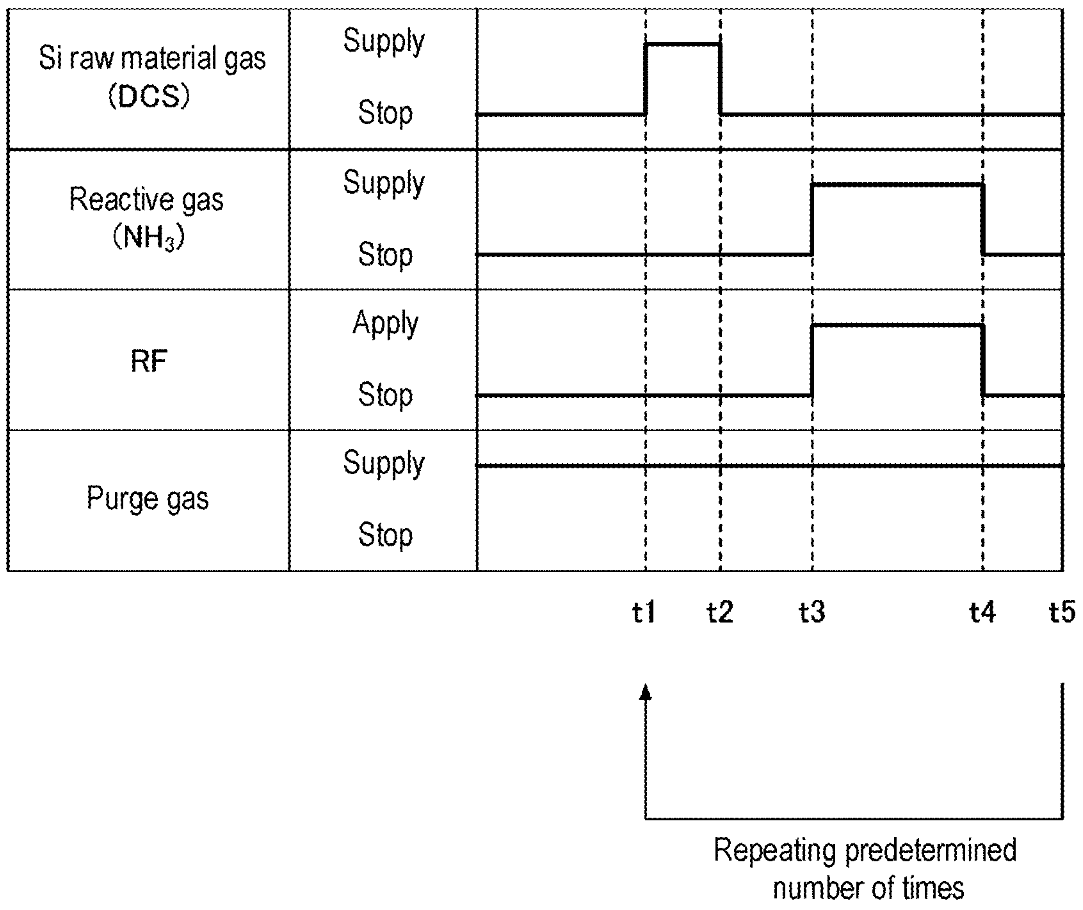
FIG. 9 is a time chart showing the example of the film formation method of the SiN film.

An example of a method of forming the SiN film performed by the substrate processing apparatus 10 is described with reference to FIGS. 8 and 9. FIG. 8 is a flowchart showing an example of a SiN film formation method. FIG. 9 is a time chart showing the example of the SiN film formation method according to the embodiment. Hereinafter, an example is described in which the SiN film is formed by an ALD method using DCS gas as the Si raw material gas, $NH_3$ gas as the reactive gas, and Ar gas as the purge gas.

First, the temperature inside the first chamber 11 is adjusted to 100 degrees C. or higher, and the substrate holder 30 with the plurality of substrates W mounted thereon is loaded into the first chamber 11. Next, the inside of the first chamber 11 is adjusted to a predetermined pressure while the inside of the first chamber 11 is exhausted by the exhauster 50.

In step S21 of FIG. 8, DCS gas is supplied into the first chamber 11 from time t1 to time t2 shown in FIG. 9. As a result, the silicon-containing gas is adsorbed on the surface of the substrate W, thereby forming a Si-containing layer.

Next, in step S22, the inside of the first chamber 11 is replaced with Ar gas while the inside of the first chamber 11 is exhausted by the exhauster 50. As shown in FIG. 9, the purge gas has been continuously supplied since before time t1. As a result, the silicon-containing gas remaining in the first chamber 11 is discharged, and an atmosphere inside the first chamber 11 is replaced with the Ar gas.

Next, in step S23, $NH_3$ gas is supplied to the plasma box 19 from time t3 to time t4 shown in FIG. 9, and a radio-frequency voltage is applied from the RF power source 55 to the electrodes 81 and 82 from time t3 to time t4 shown in FIG. 9. Therefore, plasma of $NH_3$ gas is generated in the plasma box 19, and a reactive species such as radicals in the plasma is supplied into the first chamber 11.

Next, in step S24, the inside of the first chamber 11 is replaced with Ar gas while the first chamber 11 is exhausted by the exhauster 50. As a result, the $NH_3$ gas remaining in the first chamber 11 is discharged, and the atmosphere in the first chamber 11 is replaced with the Ar gas.

Next, steps S21 to S24 are repeated until it is determined in step S25 that the steps have been repeated a set number of times, thereby forming a SiN film having a predetermined thickness. Next, the substrate holder 30 holding the plurality of substrates W on which the SiN film is formed is unloaded from the first chamber 11, and the processing is completed.

In the above embodiment, the case in which the SiN film is formed by the plasma ALD method has been described, but the technique of the present disclosure is not limited thereto. For example, nitridation may be performed by heat treatment. For example, the SiN film may be formed by a CVD method. For example, instead of the SiN film, a $SiO_2$ film, a metal nitride film, a metal oxide film, or the like may be formed.

<$SiO_2$ Film Formation Method>

Figure 10:
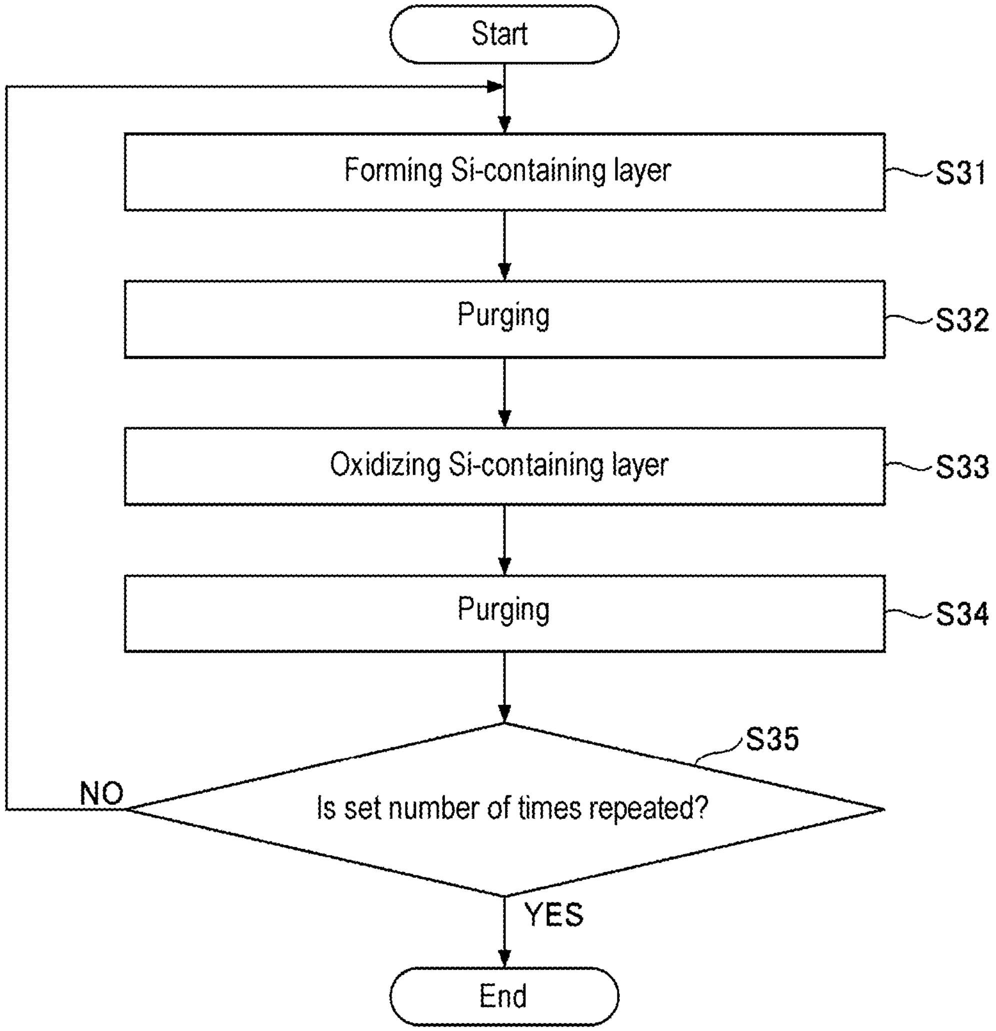
FIG. 10 is a flowchart showing an example of a film formation method of a $SiO_2$ film.
Figure 11:
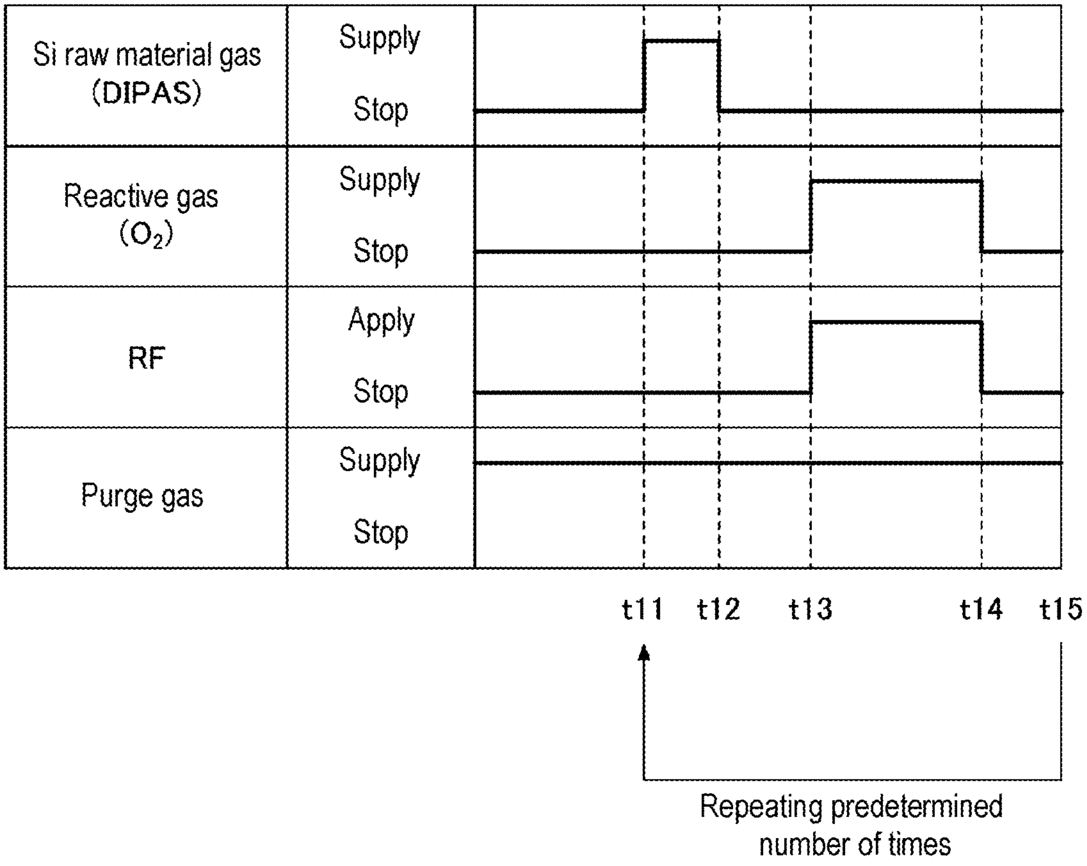
FIG. 11 is a time chart showing the example of the film formation method of the $SiO_2$ film.

An example of a method for forming the $SiO_2$ film performed by the substrate processing apparatus 10 is described with reference to FIGS. 10 and 11. FIG. 10 is a flowchart showing an example of a $SiO_2$ film formation method. FIG. 11 is a time chart showing the example of the $SiO_2$ film formation method according to the embodiment. Herein, the $SiO_2$ film may be a film that is filled in the recess by the film formation performed in the first chamber 11 or a $SiO_2$ film as the protective film performed in the second chamber 21. Hereinbelow, the $SiO_2$ film is formed by an ALD method using DIPAS gas as the Si raw material gas, $O_2$ gas as the reactive gas, and Ar gas as the purge gas.

When forming the $SiO_2$ film filled in the recess, the temperature inside the first chamber 11 is adjusted to 100 degrees C. or higher, and the substrate holder 30 with the plurality of substrates W mounted thereon is loaded into the first chamber 11. Next, the inside of the first chamber 11 is adjusted to a predetermined pressure while exhausting the inside of the first chamber 11 by the exhauster 50.

On the other hand, when forming the $SiO_2$ film as the protective film, the temperature inside the second chamber 21 is adjusted to less than 100 degrees C., and the substrate holder 30 with the plurality of substrates W mounted thereon is loaded into the second chamber 21. Next, the inside of the second chamber 21 is adjusted to a predetermined pressure while exhausting the inside of the second chamber 21 by the exhauster 50.

In step S31 in FIG. 10, DIPAS gas is supplied into the first chamber 11 from time t11 to time t12 shown in FIG. 11. As a result, the silicon-containing gas is adsorbed on the surface of the substrate W to form a Si-containing layer.

Next, in step S32, the inside of the chamber is replaced with Ar gas while the inside of the chamber is exhausted by the exhauster 50. As shown in FIG. 11, the purge gas has been continuously supplied since before time t11. As a result, the silicon-containing gas remaining in the chamber is discharged, and an atmosphere inside the chamber is replaced with Ar gas.

Next, in step S33, $O_2$ gas is supplied to the plasma box 19 from time t13 to time t14 shown in FIG. 11, and a radio-frequency voltage is applied from the RF power source 55 to the electrodes 81 and 82 from time t13 to time t14 shown in FIG. 11. As a result, plasma of $O_2$ gas is generated in the plasma box 19, and a reactive species such as radicals in the plasma is supplied into the chamber.

Next, in step S34, the inside of the chamber is replaced with Ar gas while the inside of the chamber is exhausted by the exhauster 50. As a result, the $O_2$ gas remaining in the chamber is discharged, and the atmosphere inside the first chamber 11 is replaced with the Ar gas.

Next, steps S31 to S34 are repeated a predetermined number of times until it is determined in step S35 that a set number of times has been repeated, thereby forming a $SiO_2$ film with a predetermined thickness. Then, the substrate holder 30 holding the plurality of substrates W on which the $SiO_2$ film is formed is unloaded from the chamber, and the processing is completed.

As described above, according to the filling method and substrate processing system of the embodiment, the film in the recess formed on the substrate moving between the chambers may be protected from oxidation and contamination, thereby improving the film properties.

It should be considered that the filling method and the substrate processing system according to the embodiments disclosed are illustrative in all respects and not restrictive. The embodiments may be modified and improved in various ways without departing from the spirit of the appended claims. The matters described in the above-described embodiments may be configured in other ways without being inconsistent, and may be combined without being inconsistent.

The present application claims priority based on Japanese Patent Application No. 2022-054037 filed in Japanese Patent Office on Mar. 29, 2022, the disclosure of which is incorporated herein in its entirety by reference.

EXPLANATION OF REFERENCE NUMERALS

10: substrate processing apparatus, 11: first chamber, 21: second chamber, 40: gas supplier, 50: exhauster, 60: heater, 90: controller, 102: SiN film, 103: modified layer, 104: protective film, 41A to 41E: gas nozzles

What is claimed is:

1. A filling method of filling a film containing a predetermined element in a recess formed on a substrate, the filling method comprising:

(a) forming, in a first chamber, a first film, which is the film containing the predetermined element, in the recess;

(b) forming, in a second chamber, a modified layer by exposing the first film to a gas including a halogen-containing gas;

(c) forming, in the second chamber, a protective film covering the modified layer;

(d) sublimating, in a third chamber, the modified layer and simultaneously etching the protective film; and (e) forming, in the third chamber, a second film, which is the film containing the predetermined element, in the recess, wherein, in (a), the inside of the first chamber is controlled to a temperature equal to or higher than 100 degrees C., wherein, in (b) and (c), the inside of the second chamber is controlled to a temperature less than 100 degrees C., and wherein, in (d) and (e), the inside of the third chamber is controlled to a temperature equal to or higher than 100 degrees C.

2. The filling method of claim 1, wherein the predetermined element is any of Si, Ge, or a metal.

3. The filling method of claim 2, wherein the metal is any of Ti, Al, or W.

4. The filling method of claim 1, wherein in (a), the first film is formed such that an upper portion of the recess is not blocked.

5. The filling method of claim 1, further comprising:

(f) forming a modified layer by exposing the second film to a gas including a halogen-containing gas in the second chamber, wherein (f), (c), (d), and (e) are sequentially repeated to plurally deposit the film containing the predetermined element.

6. The filling method of claim 1, wherein in (b), the halogen-containing gas and a basic gas are supplied.

7. The filling method of claim 6, wherein the basic gas is an ammonia gas.

8. The filling method of claim 1, wherein in (d), a halogen-containing gas is supplied as an etching gas of the protective film.

9. The filling method of claim 1, wherein the halogen-containing gas contains F.

10. The filling method of claim 1, wherein the first chamber and the third chamber are a same chamber.

11. The filling method of claim 1, wherein the first chamber and the second chamber are different chambers, and wherein the substrate is exposed to an atmosphere upon moving between the first chamber and the second chamber.

12. The filling method of claim 1, wherein a difference between a temperature inside the second chamber in (c) and a temperature inside of the third chamber in (d) is 150 degrees C. or higher.

13. The filling method of claim 1, wherein the protective film is an oxide film containing the predetermined element.

* * * * *